(12) United States Patent  
Wimplinger

(10) Patent No.: US 9,673,167 B2  
(45) Date of Patent: Jun. 6, 2017

(54) METHOD FOR BONDING SUBSTRATES

(75) Inventor: Markus Wimplinger, Ried im Innkreis (AT)

(73) Assignee: EV GROUP E. THALLNER GMBH, St. Florian am Inn (AT)

(*) Notice: Subject to any disclaimer, the term of this patent is extended or adjusted under 35 U.S.C. 154(b) by 319 days.

(21) Appl. No.: 14/416,297

(22) PCT Filed: Jul. 26, 2012

(86) PCT No.: PCT/EP2012/064736  
§ 371 (c)(1),  
(2), (4) Date: Jan. 22, 2015

(87) PCT Pub. No.: WO2014/015912  
PCT Pub. Date: Jan. 30, 2014

(65) Prior Publication Data  
US 2015/0179604 A1 Jun. 25, 2015

(51) Int. Cl.  
*H01L 23/00* (2006.01)  
*H01L 31/18* (2006.01)  
(Continued)

(52) U.S. Cl.  
CPC .......... *H01L 24/83* (2013.01); *B32B 37/24* (2013.01); *B32B 38/0008* (2013.01);  
(Continued)

(58) Field of Classification Search  
CPC ......... H01L 24/83; H01L 24/27; H01L 24/29; H01L 24/32; H01L 24/75; H01L 24/18; B32B 37/24; B32B 38/0008; C23C 14/08; C23C 14/081; C23C 14/086; C23C 16/40; C23C 16/403; C23C 16/407  
See application file for complete search history.

(56) References Cited

U.S. PATENT DOCUMENTS 7,041,529 B2 5/2006 Yamada et al. ............ 438/93  
7,419,884 B2 9/2008 Kerdiles ................... 438/455  
(Continued)

FOREIGN PATENT DOCUMENTS

CN 101174659 A 5/2007 ........... H01L 31/18  
CN 101138071 A 3/2008 ........... H01L 21/18  
(Continued)

OTHER PUBLICATIONS

Office Action issued in corresponding Japanese Patent Application No. 2015-523427 dated Apr. 25, 2016.  
(Continued)

*Primary Examiner* — Daniel McNally  
(74) *Attorney, Agent, or Firm* — Kusner & Jaffe

(57) ABSTRACT

This invention relates to a method for bonding of a first contact area of a first at least largely transparent substrate to a second contact area of a second at least largely transparent substrate, on at least one of the contact areas an oxide being used for bonding, from which an at least largely transparent interconnection layer is formed with an electrical conductivity of at least 10e1 S/cm² (measurement: four point method, relative to temperature of 300K) and an optical transmittance greater than 0.8 (for a wavelength range from 400 nm to 1500 nm) on the first and second contact area.

3 Claims, 1 Drawing Sheet

(51) Int. Cl.
*B32B 37/24* (2006.01)
*B32B 38/00* (2006.01)
*C23C 14/08* (2006.01)
*C23C 16/40* (2006.01)

(52) U.S. Cl.
CPC ............ *C23C 14/08* (2013.01); *C23C 14/081* (2013.01); *C23C 14/086* (2013.01); *C23C 16/40* (2013.01); *C23C 16/403* (2013.01); *C23C 16/407* (2013.01); *H01L 24/27* (2013.01); *H01L 24/29* (2013.01); *H01L 24/32* (2013.01); *H01L 24/75* (2013.01); *H01L 31/18* (2013.01); *B32B 2037/243* (2013.01); *B32B 2037/246* (2013.01); *B32B 2457/14* (2013.01); *H01L 2224/278* (2013.01); *H01L 2224/2741* (2013.01); *H01L 2224/2745* (2013.01); *H01L 2224/27418* (2013.01); *H01L 2224/27452* (2013.01); *H01L 2224/27848* (2013.01); *H01L 2224/2908* (2013.01); *H01L 2224/29187* (2013.01); *H01L 2224/29287* (2013.01); *H01L 2224/29394* (2013.01); *H01L 2224/29395* (2013.01); *H01L 2224/3201* (2013.01); *H01L 2224/32145* (2013.01); *H01L 2224/32501* (2013.01); *H01L 2224/7501* (2013.01); *H01L 2224/75101* (2013.01); *H01L 2224/83001* (2013.01); *H01L 2224/83002* (2013.01); *H01L 2224/83011* (2013.01); *H01L 2224/83012* (2013.01); *H01L 2224/83013* (2013.01); *H01L 2224/8322* (2013.01); *H01L 2224/83065* (2013.01); *H01L 2224/83075* (2013.01); *H01L 2224/8383* (2013.01); *H01L 2224/83896* (2013.01); *H01L 2224/83907* (2013.01); *H01L 2924/0103* (2013.01); *H01L 2924/0105* (2013.01); *H01L 2924/01009* (2013.01); *H01L 2924/01013* (2013.01); *H01L 2924/01031* (2013.01); *H01L 2924/01049* (2013.01); *H01L 2924/01051* (2013.01); *H01L 2924/053* (2013.01); *H01L 2924/12042* (2013.01); *H01L 2924/20102* (2013.01)

(56) References Cited

U.S. PATENT DOCUMENTS

| | | | |
|---|---|---|---|
| 8,021,910 B2 | 9/2011 | Ito et al. | 438/73 |
| 9,209,326 B2 | 12/2015 | Ji et al. | H01L 31/02248 |
| 2004/0135166 A1 | 7/2004 | Yamada et al. | 257/103 |
| 2006/0240642 A1* | 10/2006 | Kerdiles | H01L 21/76254 |
| | | | 438/455 |
| 2007/0001186 A1 | 1/2007 | Murai et al. | 257/98 |
| 2010/0187555 A1 | 7/2010 | Murai et al. | 257/98 |
| 2011/0290320 A1 | 12/2011 | Ito et al. | 136/256 |

FOREIGN PATENT DOCUMENTS

| | | | | |
|---|---|---|---|---|
| CN | 101933159 A | | 12/2010 | ........... H01L 31/042 |
| EP | 1798774 A2 * | | 6/2007 | ..... H01L 31/022466 |
| JP | 2004-146541 | | 5/2004 | ............ H01L 33/06 |
| JP | 2008-535230 | | 8/2008 | ............ H01L 21/02 |
| JP | 2011-524463 | | 9/2011 | ............ B32B 15/08 |
| KR | 2007-0114769 A | | 12/2007 | ........... H01L 21/203 |
| TW | 200710971 | | 3/2007 | ............ H01L 21/30 |
| TW | 200948179 | | 11/2009 | ............ H05B 33/10 |
| WO | 2006/111533 | | 10/2006 | ............ H01L 21/18 |
| WO | WO 2009/136863 A1 | | 11/2009 | ............ H05B 33/26 |

OTHER PUBLICATIONS

Search Report in related Taiwanese Patent Application No. 102126157 dated Sep. 26, 2016 (English-language translation provided).
Office Action issued in related Taiwanese Patent Application No. 102126157 dated Oct. 4, 2016.
International Search Report from corresponding International Patent Application No. PCT/EP2012/064736, dated Jun. 11, 2013.
"Combined Process for Wafer Direct Bonding by Means of the Surface Activation Method" written by Suga et al., 2004 Electronic Components and Technology Conference, pp. 484-490.

* cited by examiner

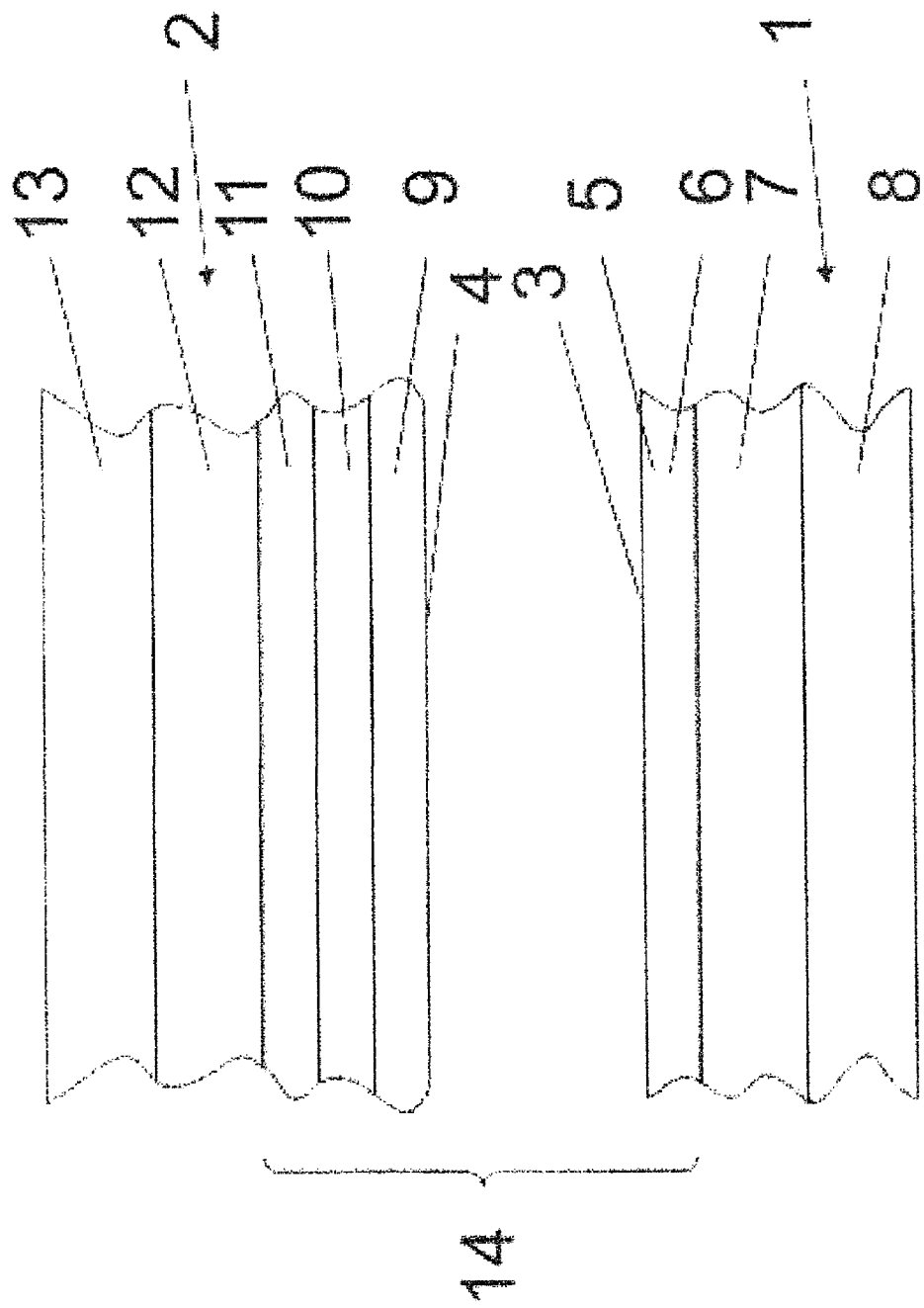

METHOD FOR BONDING SUBSTRATES

RELATED APPLICATIONS

This application is a National Stage of International Application No. PCT/EP2012/064736, filed Jul. 26, 2012.

FIELD OF THE INVENTION

This invention relates to a method for bonding of a first contact area of a first substrate which is largely transparent to a certain wavelength range to a second contact area of a second substrate which is largely transparent to a certain wavelength range as claimed in claim 1, a method for producing a first substrate.

BACKGROUND OF THE INVENTION

Generic methods are used to produce multilayer semiconductor, glass or ceramic composites. One important application relates to the production of multilayer photovoltaic cells.

One of the main limitations in the production of multilayer cells is the incompatibility of the lattice structures of the individual semiconductor materials with respect to their dimension (size) and shape. In the production of the individual layers by direct growth of layers on one another, this limitation leads to defects in the semiconductor layer, which has been implemented with it. These defects adversely affect the quality of the produced layer and especially the attainable efficiency for the conversion of light into electrical energy. Limitations with respect to the following parameters result from this in practice:

a) the number of attainable active layers in the structure. This is limited at present to a maximum of two to three layers due to the above-described problems.

b) optimization of the individual layers with respect to the optimum wavelength range. In practice, it is not currently possible to optimize the individual layers with respect to the optimum wavelength range and associated conversion characteristics for the conversion of light into electrical energy, since compromises must always be reached with respect to the compatibility of the lattice structure.

c) use of more favorable materials. For certain wavelengths it would be desirable to use, for example, silicon or germanium since these materials would allow an ideal compromise between efficiency and costs. However, the use of these materials is often not possible since the lattice structure is not adequately compatible with the other structures which are used in the cell.

And advantage of this invention is a method which enables the production of the aforementioned multilayer composites more efficiently and with more diverse parameters.

This advantage is achieved with the features of claims 1, 2 and 4. Advantageous developments of the invention are given in the dependent claims. All combinations of at least two of the features given in the specification, the claims and/or the figures also fall within the framework of the invention. At the given value ranges, values within the indicated limits will also be considered to be disclosed as boundary values and will be claimed in any combination.

SUMMARY OF THE INVENTION

The invention is based on the concept of bonding two substrates, instead of growing two layers, and being able to provide several layers with different (especially optical) properties by the bonding.

The invention is based on the concept of producing the individual layers located in the cell structure, e.g., the interconnection layer, which is intended for bonding, on separate substrates before making contact and only later stacking/bonding them. Thus, the individual layers can be produced on growth substrates which have been optimized for this purpose. This is possible by means of growing by MOCVD.

One aspect of this invention is how these layers can be stacked in an electrically conductive and optically transparent form with a simultaneously economical process. Moreover, the preparation of the substrates, which is necessary for this purpose, is described.

The described method is preferably suitable for stacking of multilayer solar cells. Alternatively, the method can also be used to produce any other structures and components in which optically transparent and electrically conductive interconnections between any (especially optical) materials, such as semiconductor materials, glasses and ceramics are necessary. In this field, more applications are arising due to the greatly increased importance of solid state light sources such as LEDs and lasers in a host of applications such as lighting, communications, and working of materials. In the display production sector, new innovative product technologies are also becoming increasingly important since additional functions such as contact detection (feedback in the area of touch screens, etc.) are to be integrated into displays.

Advantages of the invention are mainly the following:
electrically conductive, optically transparent bonding interface (interconnection layer),
very thin, durable layer(s) which are stable over the long term,
temperature-resistant layer(s) and
high efficiency (fast and economical in production).

A central, especially original aspect of this invention is the use of transparent conductive oxides for producing the electrically conductive and optically transparent interconnection layer between the substrates. The interconnection is produced especially by means of wafer bonding, preferably with a direct bonding method and even more preferably a direct bonding method with plasma activation.

Indium-tin-oxide (ITO) is used as the transparent conductive oxides (TCO). The abbreviation ITO will be used below for "indium-tin-oxide." ITO is widely used in the production of LCD displays, where it is used as an optically transparent electrical conductor. Alternatively, the following materials are used:
doped zinc oxide, such as aluminum doped zinc oxide (AZO), gallium doped zinc oxide (GZO),
fluorine [doped] tin oxide (FTO), and
antimony tin oxide (ATO).

Basically, any material which can be oxidized and which with appropriate doping has the desired properties, i.e., electrical conductivity and optical transparency, can be used.

In this connection, electrical conductivity is addressed when the material has a conductivity of $>10e1$ $S/cm^2$, preferably $10e2$ $S/cm^2$, more preferably $10e3$ $S/cm^2$ (measured with the four point method which is conventional in semiconductor technology, relative to a temperature of 300 K). The optical transmission (transmittance) defined as that percentage of light of a certain wavelength range, which the layer is designed to pass according to the application, should be at least $>80\%$, advantageously $>87\%$, preferably $>93\%$ and even more preferably $>96\%$ by a film with a predetermined thickness.

Wavelength ranges, which extend from 300 nm to 1800 nm, are preferred for photovoltaic applications. This means that the relevant wavelength range is in any case larger than the wavelength range visible to humans. This is intended to ensure that the UV portion of the light and the IR portion of the light can be converted into electrical energy. Since in a multilayer solar cell the uppermost layer is already processing a part of the spectrum, and thus is converting it into electrical energy, it is acceptable if the bond interconnection has somewhat smaller wavelength range in which it allows transmission. Therefore, the aforementioned transmission values will apply at least to wavelengths >600 nm, advantageously >500 nm, more advantageously >400 nm, and most advantageously >350 nm. Furthermore, the transmission values should also apply especially to the entire wavelength range proceeding from the minimum wavelength range to a maximum 1300 nm, advantageously up to a maximum 1500 nm, more advantageously up to a maximum 1700 nm, and most advantageously up to a maximum 1800 nm.

The oxides are applied to the substrates which are to be interconnected by means of the following methods:
MO CVD, metal organic molecular beam deposition, spray pyrolysis, pulsed laser deposition (PLD) or sputtering.

To ensure the desired properties of the layers, it is critical to ensure the correct mixing ratio. In particular, the proportion of oxygen can improve the optical transparency in some of these oxides, its having to be ensured that the oxygen portion is not too high since otherwise the electrical conductivity is reduced.

Generally, the bond interconnection (interconnection layer, also bonding interface) is produced by a precursor laminar structure being deposited on the substrates to be bonded. Then, the layers are plasma-activated and joined at room temperature, as a result of which a prebond (temporary bond) is formed. During the subsequent heat treatment process (annealing), the precursor laminar structure is converted into a layer comprised of transparent electrically conductive oxide, the bond interconnection being strengthened at the same time.

One embodiment of the method as claimed in the invention is described using two semiconductor wafers (first and second substrate). The method can, however, also be applied analogously to any other optically specific combination of materials.

In a first module (coating apparatus), the first semiconductor layer is grown on a first carrier which is formed by the substrate itself (later back-thinning) which due to its crystal structure and its surface is suited for growing a first semiconductor layer (first substrate). Thereupon, one layer (first oxide layer) of the selected TCO is deposited in-situ, i.e. without removing the substrate from the coating apparatus, which has been used for the growth of the semiconductor layer. The in-situ process ensures that this TCO can adhere directly to the semiconductor without its being able to form an oxide, which would influence the electrical conductivity. This is ensured when the substrate in-situ is transported in the apparatus (comprised of other modules) in a protective atmosphere, which is as free as possible of oxidizing elements in the atmosphere. This is ensured in atmospheres which are largely free of oxygen and water. Preferably, this is ensured by the configuration of the apparatus with a high vacuum atmosphere in which the pressure is less than $1*e^5$ mbar, preferably less than $1*e^6$ mbar, and most preferably less than $1*e^7$ mbar.

The second semiconductor layer is grown on a second carrier, which with respect to the crystal structure and surface is optimized for the growth of a second semiconductor layer (second substrate). In-situ a TCO layer (second oxide layer) comprised of a selected TCO material is optionally deposited on this layer.

A precursor layer (third oxide layer) with a layer thickness D3 is then deposited on this TCO layer 2″. This precursor layer is chosen such that the material is not yet completely oxidized, but compared to the already deposited TCO layer (second oxide layer) has an oxygen deficiency. In particular at least >30%, preferably at least >45%, more preferably at least >60%, and most preferably >75% of the oxygen volume $S_{max}$, which would be necessary for complete oxidation, are absent.

A TCO layer (fourth oxide layer) comprised of the selected TCO material with a thickness D4 is then optionally deposited on this precursor layer.

D3 is chosen to be so large that there is enough volume to later ensure during the reaction a relatively large volumetric growth so that a complete closing of the defects in the bonding interface is ensured. At the same time, the layer thickness is chosen to be so small that preferably all the material contained in this layer is completely oxidized during the process. This is ensured for layer thicknesses with a thickness from 1 to 10 nm. Preferably, the layer thickness is between 1 to 7 nm. Even more preferably, the layer thickness is between 1 and 5 nm.

D4 is chosen such that the layer thickness is large enough to protect the underlying layer D3 from a reaction in the ambient atmosphere. In particular, the precursor layer will be largely prevented from reacting with oxygen or moisture from the ambient atmosphere and from oxidizing. In this connection, when the substrate is exposed to the ambient atmosphere at room temperature for a duration of a maximum 2 hours, advantageously less than 20% of the precursor layer will react. Even more preferably, less than 10% of this precursor layer will react. Most preferably, less than 5% of the precursor layer will react. This is ensured for layer thicknesses of the precursor layer of at least 0.5 to 1 nm. At the same time, the layer will be thin enough to later allow diffusion of the educts/educt from the reservoir (see farther below). Therefore, the maximum thickness of this layer is advantageously a maximum 2 to 3 nm. Even more advantageously, the maximum layer thickness is at most 1.5 to 2 nm. Most advantageously, the maximum layer thickness is a maximum 1 to 1.5 nm.

The first substrate is then subjected to a plasma activation process to produce a reservoir (see farther below for reservoir formation).

The substrates are then bonded at room temperature. In doing so, van der Waals forces ensure that the substrates adhere to one another at room temperature. During a subsequent annealing process, a first educt intercalated in the reservoir, e.g. $H_2O$, diffuses through the optional fourth oxide layer (exposed beforehand to plasma) and oxidizes the third oxide layer. This increases the volume of the oxidized material; this leads to closing of the defects in the surface (growth layer).

Then, one or both of the carriers, if present, can optionally be removed. Alternatively, one of the carriers can likewise be a semiconductor layer which later becomes part of the final structure.

Another aspect of this invention is, using a capacitively coupled plasma or an inductively coupled plasma or a plasma from the remote plasma apparatus, to produce a plasma wherein a reservoir for holding a first educt in one substrate is formed, which educt after making contact or producing a temporary bond between the substrates reacts with a second educt which is present in the other substrate, and which thus forms an irreversible or permanent bond between the substrates. Before or after forming the reservoir in an oxide layer on the first contact area, cleaning of the substrate or substrates, e.g., by a flushing step, occurs. This cleaning should ensure that there are no particles on the surfaces which would result in unbonded sites. The reservoir and the educt contained in the reservoir make it technically possible to induce directly on the contact areas after producing the temporary or reversible bond, in a dedicated manner, a reaction which increases the bonding speed and strengthens the permanent bond (first educt or first group with a second educt or a second group), by deformation of at least one of the contact areas by the reaction, preferably the contact area opposite the reservoir. On the opposing second contact area, there is a growth layer in which the deformation takes place and the first educt (or the first group) reacts with the second educt (or the second group) present in the reaction layer of the second substrate. To accelerate the reaction between the first educt (or the first group) and the second educt (or the second group), in one advantageous embodiment, the growth layer, which lies between the reaction layer of the second substrate and the reservoir is thinned before the substrates make contact since in this way the distance between the reaction partners is reduced in an adjustable manner and at the same time the deformation/formation of the growth layer is promoted. The growth layer is removed, at least partially and preferably completely, by the thinning. The growth layer grows again in the reaction of the first educt with the second educt even if the layer had been completely removed. The thinning of this growth layer could take place by means of etching, e.g., dry etching, polishing, sputtering or reduction of oxides. Preferably, a combination of these methods, e.g., sputtering and oxide reduction, also is conceivable.

As claimed in the invention, there can be means for inhibiting the growth of the growth layer before the contact areas make contact, by passivation of the reaction layer of the second substrate, preferably by exposure to $N_2$, forming gas or an inert atmosphere or under a vacuum or by amorphization. In this connection, treatment with plasma which contains forming gas has proven especially suitable. Here, forming gas is defined as gases which contain at least 2%, better 4%, ideally 10% or 15% hydrogen. The remaining portion of the mixture consists of an inert gas such as for example nitrogen or argon.

When using forming gas, it is possible to thin the oxide layer by a process which is based on sputtering and oxide reduction.

Alternatively or in addition to this measure, it is advantageous to minimize the time between the thinning and the contact-making, especially <2 hours, preferably <30 minutes, even more preferably <15 minutes, ideally <5 minutes. Thus, the oxide growth which takes place after thinning can be minimized.

The diffusion rate of the educts through the growth layer is increased by the growth layer which has been thinned and which is thus very thin at least at the beginning of the formation of the permanent bond or at the start of the reaction. This leads to a shorter transport time of the educts at the same temperature.

For the prebonding step, for producing a temporary or reversible bond between the substrates, there are various possibilities with the objective of producing a weak interaction between the contact areas of the substrates. The prebond strengths are below the permanent bond strengths, at least by a factor of 2 to 3, especially by a factor of 5, preferably by a factor of 15, still more preferably by a factor of 25. As guideline values, the prebond strengths of pure, nonactivated, hydrophilized silicon with roughly $100$ $mJ/m^2$ and of pure, plasma-activated hydrophilized silicon with roughly $200$-$300$ $mJ/m^2$ are mentioned. The prebonds between the molecule-wetted substrates arise mainly due to the van der Waals interactions between the molecules of the different wafer sides. Accordingly, mainly molecules with permanent dipole moments are suitable for enabling prebonds between wafers. The following chemical compounds are mentioned as interconnection agents by way of example, but not limited thereto:

water,
thiols,
AP3000,
silanes and/or
silanols.

Suitable substrates are those whose material is able to react as an educt with another supplied educt to form a product with a higher molar volume, as a result of which the formation of a growth layer on the substrate is caused. The following combinations are especially advantageous. To the left of the arrow the educt is named and to the right of the arrow, the product/products, without the supplied educt or byproducts which react with the educt is named in particular:

$Si \rightarrow SiO_2$, $Si_3N_4$, $SiN_xO_y$,
$Ge \rightarrow GeO_2$, $Ge_3N_4$
$\alpha$-$Sn \rightarrow SnO_2$
$B \rightarrow B_2O_3$, $BN$
$Se \rightarrow SeO_2$
$Te \rightarrow TeO_2$, $TeO_3$
$Mg \rightarrow MgO$, $Mg_3N_2$
$Al \rightarrow Al_2O_3$, $AlN$
$Ti \rightarrow TiO_2$, $TiN$
$V \rightarrow V_2O_5$
$Mn \rightarrow MnO$, $MnO_2$, $Mn_2O_3$, $Mn_2O_7$, $Mn_3O_4$
$Fe \rightarrow FeO$, $Fe_2O_3$, $Fe_3O_4$
$Co \rightarrow CoO$, $Co_3O_4$,
$Ni \rightarrow NiO$, $Ni_2O_3$
$Cu \rightarrow CuO$, $Cu_2O$, $Cu_3N$
$Zn \rightarrow ZnO$
$Cr \rightarrow CrN$, $Cr_{23}C_6$, $Cr_3C$, $Cr_7C_3$, $Cr_3C_2$
$Mo \rightarrow Mo_3C_2$
$Ti \rightarrow TiC$
$Nb \rightarrow Nb_4C_3$
$Ta \rightarrow Ta_4C_3$
$Zr \rightarrow ZrC$
$Hf \rightarrow HfC$
$V \rightarrow V_4C_3$, $VC$
$W \rightarrow W_2C$, $WC$
$Fe \rightarrow Fe_3C$, $Fe_7C_3$, $Fe_2C$
$In \rightarrow In_2O_3$
$Sn \rightarrow Sn_2O_2$
$Sn \rightarrow SnO$
$Zn \rightarrow ZnO$
$Al \rightarrow Al_2O_3$ The following mixed forms of semiconductors are moreover conceivable as substrates:

III-V: GaP, GaAs, InP, InSb, InAs, GaSb, GaN, AN, InN, $Al_xGa_{1-x}As$, $In_xGa_{1-x}N$
IV-IV: SiC, SiGe,
III-VI: InAlP.
nonlinear optics: $LiNbO_3$, $LiTaO_3$, KDP ($KH_2PO_4$)
solar cells: CdS, CdSe, CdTe, $CuInSe_2$, $CuInGaSe_2$, $CuInS_2$, $CuInGaS_2$
conductive oxides: $In_{2-x}SnxO_{3-y}$ On at least one of the wafers and directly on the respective contact area there is the reservoir (or reservoirs) in which a certain amount of at least one of the supplied educts for the volume expansion reaction can be stored. Educts can therefore be for example $O_2$, $O_3$, $H_2O$, $N_2$, $NH_3$, $H_2O_2$, etc. Due to the expansion, dictated by oxide growth, based on the tendency of the reaction partners to reduce system energy, possible gaps, pores, and cavities between the contact areas are minimized and the bond force is increased accordingly by narrowing the distances between the substrates in these regions. In the best possible case the existing gaps, pores and cavities are completely closed so that the entire bonding area increases and thus the bond force as claimed in the invention rises accordingly.

The contact areas conventionally show a roughness with a quadratic roughness ($R_q$) of 0.2 nm. This corresponds to peak-to-peak values of the surfaces in the range of 1 nm. These empirical values were determined with atomic force microscopy (AFM).

The reaction is suitable for allowing the growth layer to grow by 0.1 to 0.3 nm for a conventional wafer surface of a circular wafer with a diameter from 200 to 300 mm with 1 monolayer (ML) of water.

It is therefore provided in particular that at least 2 ML, preferably at least 5 ML, even more preferably at least 10 ML of fluid, e.g., water, be stored in the reservoir.

The formation of the reservoir by exposure to plasma is especially preferable, since plasma exposure moreover causes smoothing of the contact area and hydrophilization as synergy effects. The surface is smoothed by plasma activation predominantly by a viscous flow of the material of the oxide layer and optionally of the reaction layer. The increase of the hydrophilicity takes place by the increase of the silicon hydroxyl compounds, preferably by cracking of Si—O compounds present on the surface, such as Si—O—Si, according to the following reaction:

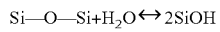

$$\text{Si—O—Si} + H_2O \leftrightarrow 2\text{SiOH}$$

For other surfaces, it can generally be stated that an increase of the density of the isolated OH compounds occurs; this results in improved hydrophilicity.

Another side effect, as a result of the aforementioned effects, is that the prebond strength is improved by a factor of 2 to 3.

The reservoir in the oxide layer on the first contact area of the first substrate (and optionally of an oxide layer on the second contact area of the second substrate) is formed for example by plasma activation of the first substrate which has been coated with a thermal oxide. The plasma activation is carried out in a vacuum chamber in order to be able to set the conditions necessary for the plasma. For the plasma discharge, $N_2$ gas, $O_2$ gas or argon gas with ion energies in the range from 0 to 2000 eV (amplitude) is used, as a result of which a reservoir is produced with a depth of up to 20 nm, preferably up to 15 nm, more preferably up to 10 nm, most preferably up to 5 nm, of the treated surface, in this case the first contact area By setting a certain pressure in the vacuum chamber, the average free path length for the plasma ions can be conceivably influenced.

Reproducible results in the production of the reservoir on the contact area/surfaces is possible by the inventive use of two different frequencies on the opposing electrodes to produce the plasma, which electrodes accelerate the plasma ions especially with application of an alternating current or an ac voltage, and/or by the use of an inductively coupled plasma source and/or remote plasma.

In the case of capacitive coupling, it is advantageous if the electrodes are located within the plasma chamber.

Here, optimum exposure of the contact areas and thus production of a reservoir which is defined exactly, in terms of volume and/or depth, are enabled by setting the parameters the (different) frequencies of the electrodes, the amplitudes, preferably exclusively, the bias voltage applied on the second electrode and the chamber pressure.

The execution of the plasma activation apparatus as a capacitively coupled, double frequency plasma apparatus advantageously enables a separate setting of the ion density and the acceleration of the ions onto the wafer surface. Thus, attainable process results can be set within a wide window and optimally matched to the demands of the application.

The bias voltage, in the form of a base voltage of the second, lower electrode, is used to influence the impact (speed) of the electrodes on the contact area of the substrate which is held on the second electrode, to attenuate or accelerate it.

In particular, the pore density distribution in the reservoir becomes adjustable by the aforementioned parameters, advantageous embodiments being described below.

In an inductively coupled plasma source, corresponding analogy considerations about the AC voltage of the capacitive coupling to alternating currents which are used to generate a magnetic field can be adopted. It is conceivable to manipulate the plasma of the inductively coupled plasma source by an alternating current or alternating magnetic field of varied strength and/or frequency such that the plasma has the corresponding properties.

In a remote plasma, the plasma which is to actually be used is generated in an external source and introduced into the sample space. In particular, the components of this plasma, ions, are transported into the sample space. The passage of the plasma from the source space into the substrate space can be ensured by different elements such as locks, accelerators, magnetic and/or electrical lenses, diaphragms, etc. All considerations which apply to capacitively and/or inductively coupled plasma with respect to frequencies and/or strengths of the electrical and/or magnetic fields will apply to all elements which ensure the production and/or passage of the plasma from the source space into the substrate space. For example, it would be conceivable for the plasma to be produced by capacitive or inductive coupling in the source space and afterwards for the aforementioned elements to penetrate into the substrate space.

As claimed in the invention, any particle type, atoms and/or molecules which are suitable for producing the reservoir can be used. Preferably, those atoms and/or molecules are used which the reservoir produces with the required properties. The relevant properties are mainly the pore size, pore distribution and pore density. Alternatively, gas mixtures such as for example air or forming gas consisting of 95% Ar and 5% $H_2$ can be used. Depending on the gas used, during the plasma treatment among others the following ions are present in the reservoir: N+, $N_2$+, O+, $O_2$+, Ar+. The first educt can be accommodated in the unoccupied free space of the reservoir/reservoirs. The oxide layer and accordingly the reservoir can extend into the reaction layer.

Advantageously, there are different types of plasma species which can react with the reaction layer and comprise, at least partially, preferably mostly, of the first educt. To the extent the second educt is Si/Si, an $O_x$ plasma species would be advantageous.

The reservoir is formed based on the following considerations: the pore size is smaller than 10 nm, preferably smaller than 5 nm, more preferably smaller than 1 nm, even more preferably smaller than 0.5 mm, most preferably smaller than 0.2 nm.

The pore density is preferably directly proportional to the density of the particles which produce the pores by striking action, most preferably can even be varied by the partial pressure of the striking species, and depending on the treatment time and the parameters, especially of the plasma system used.

The pore distribution preferably has at least one region of greatest pore concentration under the surface by variation of the parameters of several such regions which are superimposed into a preferably plateau-shaped region. The pore distribution decreases toward zero with increasing thickness. The near-surface region during bombardment has a pore density which is almost identical to the pore density near the surface. After the end of plasma treatment, the pore density on the surface can be reduced as a result of stress relaxation mechanisms. The pore distribution in the thickness direction with respect to the surface has one steep flank and with respect to the bulk a rather flatter, but continuously decreasing flank.

For the pore size, the pore distribution and pore density, similar considerations apply to all methods not produced with plasma.

The reservoir can be designed by controlled use and combination of process parameters. FIG. 8 of PCT/EP2012/064545, which is expressly incorporated herein by reference, shows a representation of the concentration of injected nitrogen atoms by plasma as a function of the penetration depth into a silicon oxide layer. It was possible to produce two profiles by variation of the physical parameters. The first profile 11 was produced by more highly accelerated atoms deeper in the silicon oxide, conversely the profile 12 was produced after altering the process parameters in a lower density. The superposition of the two profiles yields a sum curve 13 which is characteristic for the reservoir. The relationship between the concentration of the injected atom and/or molecule species is evident. Higher concentrations designate regions with a higher defect structure, therefore, more space to accommodate the subsequent educt. A continuous change of the process parameters which is controlled in a dedicated manner during the plasma activation makes it possible to achieve a reservoir with a distribution of the added ions over the depth, which distribution is as uniform as possible. These considerations likewise apply analogously to layers other than silicon oxide in which the reservoir can be formed in the case of other material combinations. In particular these considerations can also be applied to TCO layers.

Alternatively to a reservoir which has been produced by plasma, the use of a TEOS (tetraethylorthosilicate) oxide layer on at least one of the substrates, at least the first substrate, is conceivable as a reservoir. This oxide is generally less dense than thermal oxide, for which reason compaction is advantageous. Compaction takes place by heat treatment with the objective of setting a defined porosity of the reservoir.

According to one embodiment of the invention, the filling of the reservoir can take place at the same time with the formation of the reservoir by the reservoir being applied as a coating to the first substrate, the coating already encompassing the first educt.

The reservoir is conceivable as a porous layer with a porosity in the nanometer range or as a layer which has channels with a channel thickness smaller than 10 nm, more preferably smaller than 5 nm, even more preferably smaller than 2 nm, most preferably smaller than 1 nm, most preferably of all smaller than 0.5 nm.

For the step of filling of the reservoir with a first educt or a first group of educts, the following embodiments, also in combination, are conceivable:
  exposing the reservoir to the ambient atmosphere,
  flushing with especially deionized water,
  flushing with a fluid which contains the educt or which consists of it, especially $H_2O$, $H_2O_2$, NH4OH,
  exposing the reservoir to any gas atmosphere, especially atomic gas, molecular gas, gas mixtures,
  exposing the reservoir to a water vapor-containing or hydrogen peroxide vapor-containing atmosphere and
  depositing a reservoir already filled with the educt as an oxide layer on the first substrate.

The following compounds are possible as educts: $O_x^+$, $O_2$, $O_3$, $N_2$, $NH_3$, $H_2O$, $H_2O_2$, and/or $NH_4OH$.

The use of the above cited hydrogen peroxide vapor is regarded as the preferred version, in addition to using water. Hydrogen peroxide moreover has the advantage of having a greater oxygen to hydrogen ratio. Furthermore, hydrogen peroxide dissociates into hydrogen and oxygen above certain temperatures and/or via the use of high frequency fields in the MHz range.

On the other hand, $H_2O$ offers the advantage of having a small molecule size. The size of the $H_2O$ molecular is even smaller than that of the $O_2$ molecule, with which $H_2O$ offers the advantage of being able to be more easily intercalated in the pores and being able to diffuse more easily through the growth layer.

Mainly when using materials with different coefficients of thermal expansion, the use of methods for dissociation of the aforementioned species which do not cause any noteworthy temperature increase or at best a local/specific temperature increase is advantageous. In particular, there is microwave irradiation which at least promotes, preferably causes the dissociation.

According to one advantageous embodiment of the invention, the formation of the growth layer and strengthening of the irreversible bond takes place by diffusion of the first educt into the reaction layer.

According to another advantageous embodiment of the invention, the formation of the irreversible bond takes place at a temperature of typically less than 300° C., advantageously less than 200° C., more preferably less than 150° C., even more preferably less than 100° C., most preferably at room temperature, especially during a maximum 12 days, more preferably a maximum 1 day, even more preferably a maximum 1 hour, most preferably a maximum 15 minutes. Another advantageous heat treatment method is dielectric heating by microwaves.

Here it is advantageous if the irreversible bond has a bond strength of greater than 1.5 $J/m^2$, especially greater than 2 $J/m^2$, preferably greater than 2.5 $J/m^2$.

The bond strength can be increased advantageously in that during the reaction, as a product with a greater molar volume than the molar volume of the second educt is formed in the reaction layer. In this way, growth on the second substrate is effected, as a result of which gaps between the contact areas can be closed by the chemical reaction. As a result, the distance between the contact areas, therefore the average distance, is reduced, and dead spaces are minimized.

To the extent the formation of the reservoir takes place by plasma activation, with an activation frequency between 10 kHz and 20000 kHz, preferably between 10 kHz and 5000 kHz, even more preferably between 10 kHz and 1000 kHz, most preferably between 10 kHz and 600 kHz and/or a power density between 0.075 and 0.2 watt/cm² and/or with pressurization with a pressure between 0.1 and 0.6 mbar, additional effects such a smoothing of the contact area and also a clearly increased hydrophilicity of the contact area are caused.

Alternatively, the formation of the reservoir can take place by using a tetraethoxysilane oxide layer which has been compacted in a controlled manner to a certain porosity as the oxide layer.

According to another advantageous embodiment of the invention, the oxide layer is comprised largely, essentially completely of an amorphous silicon dioxide, e.g., a silicon dioxide which has been produced by thermal oxidation, and the reaction layer is comprised of an oxidizable material, predominantly, and preferably completely, of Si, Ge, InP, GaP or GaN (or another material mentioned alternatively above). A stable reaction which effectively closes the existing gaps is enabled by oxidation.

Between the second contact area and the reaction layer there is a growth layer, predominantly of native silicon dioxide (or another material mentioned alternatively above). The growth layer is subject to growth caused by the reaction as claimed in the invention. The growth takes place proceeding from the transition Si—SiO2 (7) by re-formation of amorphous SiO2 and the deformation caused thereby, i.e., bulging, of the growth layer, on the interface to the reaction layer, and in regions of gaps between the first and the second contact area. This causes a reduction of the distance or a reduction of the dead space between the two contact areas, as a result of which the bond strength between the two substrates is increased. A temperature between 200 and 400° C., preferably roughly 200° C. and 150° C., more preferably a temperature between 150° C. and 100° C., most preferably a temperature between 100° C. and room temperature, is advantageous. The growth layer can be divided into several growth regions. The growth layer can at the same time be an oxide layer of the second substrate in which another reservoir which accelerates the reaction is formed.

It is especially advantageous if the growth layer has an average thickness A between 0.1 nm and 5 nm prior to formation of the irreversible bond. The thinner the growth layer, the more quickly and easily the reaction takes place between the first and the second educt through the growth layer, by diffusion of the first educt through the growth layer to the reaction layer. The diffusion rate of the educts through the growth layer is increased by the growth layer which has been thinned and thus is very thin at least at the beginning of the formation of the permanent bond or at the start of the reaction. This leads to a shorter transport time of the educts at the same temperature.

According to the invention, the thinning plays a decisive part since the reaction can be further accelerated and/or the temperature further reduced by it. Thinning can be done by etching, preferably in a moist atmosphere, still more preferably in-situ. Alternatively the thinning takes place by dry etching, preferably in-situ. Here in-situ means performance in the same chamber in which at least one previous and/or one following step is/are carried out. A further apparatus arrangement which falls under the in-situ concept used here is an apparatus in which the transport of the substrates takes place between individual process chambers in an atmosphere which can be adjusted in a controlled manner, for example using inert gases, but in a vacuum environment. Wet etching takes place with chemicals in the vapor phase, while dry etching takes place with chemicals in the liquid state. To the extent the growth layer is comprised of silicon dioxide, etching with hydrofluoric acid or diluted hydrofluoric acid can be done. To the extent the growth layer is comprised of pure Si, etching can be done with KOH.

According to one embodiment of the invention, the formation of the reservoir is carried out in a vacuum. Thus contamination of the reservoir with unwanted materials or compounds can be avoided.

In another embodiment of the invention, filling of the reservoir takes place by one or more of the steps cited below:
  exposing the first contact area to the atmosphere, for filling the reservoir with atmospheric humidity and/or the oxygen contained in the air,
  exposing the first contact area to a fluid comprised predominantly, preferably almost completely, of deionized $H_2O$ and/or $H_2O_2$,
  exposing the first contact area to $N_2$ gas and/or $O_2$ gas and/or Ar gas and/or forming gas, comprised of 95% Ar and 5% $H_2$, with an ion energy in the range from 0 to 2000 eV,
  vapor deposition for filling the reservoir with any already named educt.

It is especially effective for the process sequence if the reservoir is formed preferably in a thickness R between 0.1 nm and 25 nm, more preferably between 0.1 nm and 15 nm, even more preferably between 0.1 nm and 10 nm, most preferably between 0.1 nm and 5 nm. Furthermore, according to one embodiment of the invention it is advantageous if the average distance B between the reservoir and the reaction layer immediately before formation of the irreversible bond is between 0.1 nm and 15 nm, especially between 0.5 nm and 5 nm, preferably between 0.5 nm and 3 nm. The distance B is influenced or produced as claimed in the invention by the thinning.

A device for executing the method is made as claimed in the invention with a chamber for forming the reservoir, a chamber provided separately from it for filling the reservoir, and an separately provided chamber for forming the prebond, all of which chambers are connected directly to one another via a vacuum system.

In another embodiment, the filling of the reservoir can also take place directly via the atmosphere, therefore either in a chamber which can be opened to the atmosphere or simply on a structure which does not have jacketing, but can handle the wafer semiautomatically and/or completely automatically.

The use of solar energy by means of photovoltaic systems is becoming increasingly important since fossil fuels are becoming scarce in the medium term and moreover constitute a major environmental problem in recovery and use, i.e., by the contribution to the greenhouse effect. To strengthen the competitiveness of photovoltaics from a purely economic standpoint, it is necessary to improve the efficiency of conversion of light into electrical energy at the same cost or an at most moderate cost increase. But there are limits on the possible efficiency. These limits result primarily from the restriction that a single semiconductor material can process only light with a limited wavelength range and convert it into electrical energy.

One application of this invention for producing multilayer solar cells or as in English "multi-junction solar cells" is therefore advantageous.

In them, the individual layers are stacked vertically on top of one another in the solar cell. Incident light first strikes the uppermost layer which is optimized for converting light with a certain first wavelength range into electrical energy. Light with a wavelength range which can largely not be processed in this layer penetrates this first layer and is incident on the underlying second layer which is optimized for processing a second wavelength range and thus producing electrical energy. In these multilayer cells, it is optionally possible that light with a wavelength range which also can largely not be processed in this second layer is incident on the underlying third layer which is optimized for processing light with a third wavelength range and thus producing electrical energy. It can be imagined that a plurality (n) of these layers is purely theoretically possible. In practice these cells are structured such that the uppermost layer which incident light penetrates first processes that wavelength range with the shortest wavelength. The second layer, the next shorter wavelength range, and so forth. Here as claimed in the invention not only is a two-layer structure conceivable, but three or more layers can be implemented. Here it is provided that the layers be interconnected vertically in an electrically conductive manner, i.e. with a resistance as small as possible and in an optically transparent manner. The layers are deposited by so-called "metal organic chemical vapor deposition" abbreviated "MO CVD" processes, the deposition of the two active layers of the multiple cell taking place "in-situ", i.e. without exposing the substrates to the normal ambient atmosphere between the deposition processes. Preferably between the active layers also blocking layers (second or fourth oxide layer) and/or buffer layers (second or fourth oxide layer) are placed which improve the quality of the resulting cell.

Other advantages, features and details of the invention will become apparent from the following description of preferred exemplary embodiments and using the drawings.

BRIEF DESCRIPTION OF THE DRAWING

FIG. 1 shows a schematic view of one embodiment of this invention briefly before the first substrate makes contact with the second substrate.

DETAILED DESCRIPTION OF THE PREFERRED EMBODIMENT

The same or equivalent features are identified with the same reference numbers.

The situation in FIG. 1 shows only one cross sectional segment of a first contact area 3 of a first substrate 1 and a second contact area 4 of a second substrate 2. The surfaces of the contact areas 3, 4 are terminated with polar OH groups and are accordingly hydrophilic. The first substrate 1 and the second substrate 2 are held by the force of attraction of the hydrogen bridges between the OH groups which are present on the surface and the $H_2O$ molecules and also between the $H_2O$ molecules alone, among others by van der Waals forces and/or hydrogen bridges. The hydrophilicity of at least the first substrate 1 has been increased by plasma treatment in a preceding step.

Plasma treatment takes place in a plasma chamber which can be exposed to plasma and a vacuum and/or a defined gas atmosphere and which can be provided in its own module of a corresponding apparatus. To be exposed to a vacuum and/or a defined gas atmosphere means that pressures below 1 mbar can be set and controlled. In the exemplary embodiment described here the gas is $N_2$ at a pressure of 0.3 mbar.

It is advantageous according to the alternative embodiment to subject the second substrate 2 or the second contact area 4 to plasma treatment in addition, simultaneously with the plasma treatment of the first substrate 1.

A reservoir 5 in an oxide layer 6 consisting of the selected TCO has been formed as claimed in the invention by the plasma treatment. Under the oxide layer 6, a semiconductor 7 directly adjoins and can be used among others optionally also as a reaction layer which contains a second educt or a second group of educts. Plasma treatment with $N_2$ ions with the aforementioned ion energy yields an average thickness R of the reservoir 5 of roughly 15 nm, the plasma ions forming channels or pores in the oxide layer 6. The reservoir is filled with a first educt which reacts with the second educt.

The semiconductor 7 is temporarily supported by a carrier 8 in the illustrated embodiment.

The second substrate 2 on the second contact area 4 is comprised of a fourth oxide layer 9, directly followed by a third oxide layer 10.

The oxide layer 10 (precursor layer) is comprised of a TCO which contains incompletely oxidized components so that the layer has an oxygen volume $S_1$ which is smaller than the maximum oxygen volume $S_{max}$ which would be contained in the layer if the entire volume were completely oxidized. In particular, the oxygen volume $S_1$ is a maximum 70% of $S_{max}$. Advantageously, this percentage is 55%, more advantageously 40% and most advantageously 25%.

The second oxide layer 11 is joined tightly to a semiconductor 12 of the second substrate 2 which in turn is temporarily fixed on a carrier 13.

The semiconductor 12 is used as a reaction layer which contains a second educt or a second group of educts.

A growth layer is formed by the reaction of the first educt with the second educt between the oxide layers 6, 9, 10, 11 and optionally the reaction layers (semiconductor 7, 12).

In one preferred embodiment, the first educt which has been intercalated in the reservoir 5 formed in the oxide layer 6 reacts with the precursor layer 10. This reaction results in an increase in volume since the reaction product of the first educt and the precursor layer has a higher molar volume.

By increasing the molar volume and diffusion of the $H_2O$ molecules, especially on the interface between the oxide layers 9 and 10, a volume in the form of a growth layer grows, due to the objective of minimizing the free Gibb's enthalpy intensified growth, taking place in regions in which gaps are present between the contact areas 3, 4. The gaps are closed by the increase in the volume of the growth layers.

The oxide layers 6, 9, 10, and 11 after bonding jointly form an interconnection layer 14.

This interconnection layer in one preferred embodiment after the reaction is advantageously comprised of a homogenous material which corresponds essentially to the same TCO comprising the originally deposited oxide layers 9, 11 and 6.

REFERENCE NUMBER LIST 1 first substrate
2 second substrate
3 first contact area
4 second contact area
5 reservoir
6 first oxide layer
7 first semiconductor
8 first carrier
9 fourth oxide layer
10 third oxide layer
11 second oxide layer
12 second semiconductor
13 second carrier
14 interconnection layer Having described the invention, the following is claimed:
1. A method for bonding a first contact area of a first transparent substrate to a second contact area of a second transparent substrate, on at least one of the contact areas an oxide being used for bonding to form a transparent interconnection layer on the first and second contact areas, said method comprising the following steps:
- applying a first oxide layer with an electrical conductivity of at least $10e^1$ S/cm (measurement: four point method, relative to temperature of 300K) and an optical transmittance greater than 0.8 (for a wavelength range from 400 nm to 1500 nm) to the first substrate,
- applying a second oxide layer to the second substrate,
- applying a third oxide layer to the second oxide layer, the third oxide layer having an oxygen volume $S_1$ which is smaller than 70% of the maximum oxygen volume $S_{max}$ of the third oxide layer,
- applying a fourth oxide layer to the third oxide layer,
- plasma-activating the first substrate to produce a reservoir,
- bonding the first and second substrates, wherein a first educt intercalated in the reservoir diffuses through the fourth oxide layer (9) and oxidizes the third oxide layer.

2. The method as claimed in claim 1, wherein the oxide or one or more of the oxide layers contain at least one of the following components, as doping:
- indium,
- tin,
- aluminum,
- zinc,
- gallium,
- fluorine or
- antimony.

3. The method as claimed in claim 1 or 2, wherein the oxide or one or more of the oxide layers are applied by one of the following methods:
- metal organic chemical vapor deposition,
- metal organic molecular beam deposition,
- spray pyrolysis,
- pulsed laser deposition or
- sputtering.

* * * * *